United States Patent
Coolbaugh et al.

(10) Patent No.: US 7,399,696 B2
(45) Date of Patent: Jul. 15, 2008

(54) METHOD FOR HIGH PERFORMANCE INDUCTOR FABRICATION USING A TRIPLE DAMASCENE PROCESS WITH COPPER BEOL

(75) Inventors: Douglas D. Coolbaugh, Essex Junction, VT (US); Mete Erturk, St. Albans, VT (US); Zhong-Xiang He, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 409 days.

(21) Appl. No.: 11/161,415

(22) Filed: Aug. 2, 2005

(65) Prior Publication Data
US 2007/0032030 A1 Feb. 8, 2007

(51) Int. Cl.
*H01L 21/4763* (2006.01)
(52) U.S. Cl. .................. 438/618; 438/381; 438/622; 438/631; 257/E21.022
(58) Field of Classification Search ......... 438/622–624, 438/618, 631–633, 687, 381
See application file for complete search history.

(56) References Cited

U.S. PATENT DOCUMENTS

| 6,097,273 | A | 8/2000 | Frye et al. |
|---|---|---|---|
| 6,133,079 | A | 10/2000 | Zhu et al. |
| 6,387,747 | B1 | 5/2002 | Cha et al. |
| 6,395,611 | B1 | 5/2002 | Belk et al. |
| 6,593,841 | B1 | 7/2003 | Mizoguchi et al. |
| 6,714,113 | B1 | 3/2004 | Abadeer et al. |
| 6,717,232 | B2 * | 4/2004 | Bothra ............... 257/531 |
| 2002/0097129 | A1 | 7/2002 | Johnson |
| 2003/0234436 | A1 | 12/2003 | Hsu et al. |
| 2004/0041234 | A1 | 3/2004 | Sia et al. |
| 2004/0140526 | A1 | 7/2004 | Jiong et al. |

OTHER PUBLICATIONS

J. N. Burghartz, et al., "Monolithic Spiral Inductors Fabricated Using a VLSI Cu-Damascene Interconnect Technology and Low-Loss Substrates", IEDM 1996, Dec. 8-11, 1996, pp. 99-102.

* cited by examiner

*Primary Examiner*—Thanh Nguyen
(74) *Attorney, Agent, or Firm*—Gibb & Rahman, LLC; Anthony Canale

(57) ABSTRACT

A method of forming a high performance inductor comprises providing a substrate; forming a plurality of wiring levels over the substrate, wherein each of the wiring levels comprise a dielectric layer; forming a first trench having a first depth in a first dielectric layer on a first wiring level; forming a second trench in the first dielectric layer having a second depth extending at least into a second wiring level; forming a conductor layer substantially simultaneously in the first and second trenches; and removing portions of the conductor layer overfilling the first and second trenches to form a spiral-shaped inductor in the second trench. The method may further comprise forming an interconnect structure in the first trench.

20 Claims, 7 Drawing Sheets

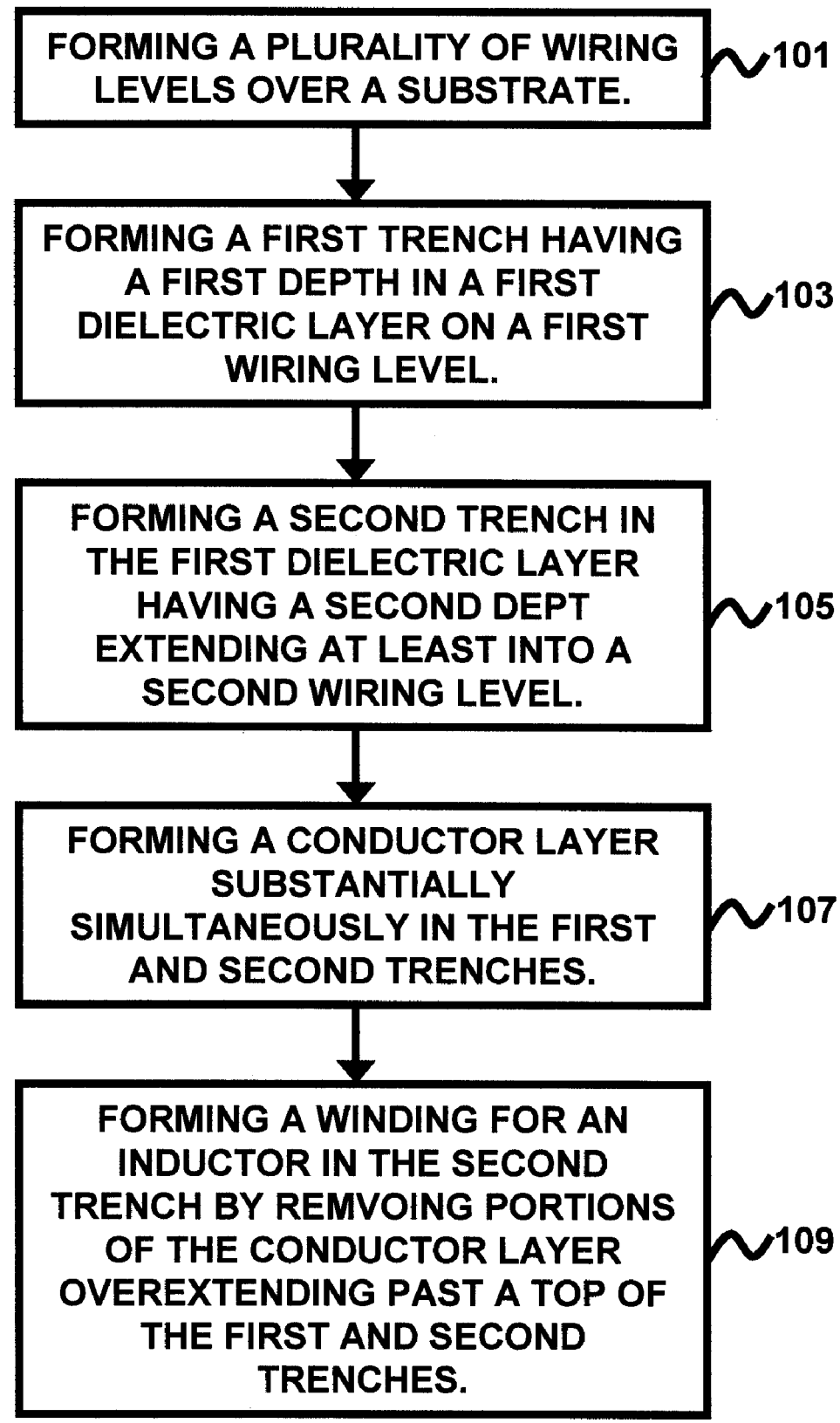

METHOD FOR HIGH PERFORMANCE INDUCTOR FABRICATION USING A TRIPLE DAMASCENE PROCESS WITH COPPER BEOL

BACKGROUND OF THE INVENTION

1. Field of the Invention

The embodiments of the invention generally relate to semiconductor device fabrication, and, more particularly, to the formation of inductive elements on integrated circuit structures using damascene processing.

2. Description of the Related Art

High performance (high-Q value) inductors are integral parts of radio frequency (RF)/wireless circuitry. Fabrication of such high-Q value inductors on an integrated circuit chip can result in significant cost savings and performance improvement. Conventionally, a generally thick (approximately 3 µm) copper (Cu) wiring level is added on top of the existing complementary metal oxide semiconductor (CMOS) back-end-of-the-line (BEOL) processing when a high performance inductor is needed.

However, the disadvantages of this additional wiring level are: (1) a thick Cu wire generally has a large pitch which can adversely impact wiring capability; (2) a thick Cu wire is generally less compatible with the CMOS logic library due to having a much lower resistance; and (3) a thick Cu wiring level generally increases overall fabrication costs significantly. Accordingly, there remains a need for a novel fabrication technique for forming high performance inductors on integrated circuit structures.

SUMMARY OF THE INVENTION

In view of the foregoing, an embodiment of the invention provides a method of forming a high performance inductor, wherein the method comprises providing a substrate; forming a plurality of wiring levels over the substrate, wherein each of the wiring levels comprise a dielectric layer; forming a first trench having a first depth in a first dielectric layer on a first wiring level; forming a second trench in the first dielectric layer having a second depth extending at least into a second wiring level; forming a conductor layer substantially simultaneously in the first and second trenches; and removing portions of the conductor layer overfilling the first and second trenches to form a spiral-shaped inductor in the second trench. The method may further comprise forming an interconnect structure in the first trench.

The method may further comprise planarizing the conductor layer. Additionally, the method may further comprise embedding the inductor within the plurality of wiring levels, wherein the forming of the conductor layer preferably comprises forming a liner along sidewalls of the first and second trenches; and plating copper metal to fill the first and second trenches and wherein the removing portions of the conductor layer overfilling the first and second trenches comprises performing a chemical mechanical polishing process on selective portions of the conductor layer. Moreover, the method may further comprise configuring the second depth to extend three wiring levels deep.

Another aspect of the invention provides a method of forming a high performance inductor, wherein the method comprises forming a plurality of wiring levels over a semiconductor substrate; forming a first trench having a first depth in a first dielectric layer on an uppermost wiring level; forming a spiral-shaped second trench in the first dielectric layer having a second depth extending at least into a wiring level below the uppermost wiring level; forming a conductor layer substantially simultaneously in the first and second trenches; and planarizing the conductor layer. The method may further comprise forming an interconnect structure in the first trench. Additionally, the spiral-shaped second trench forms an inductor. Moreover, the method preferably comprises embedding the spiral-shaped second trench within the plurality of wiring levels, wherein the forming of the conductor layer preferably comprises forming a liner along sidewalls of the first and second trenches; and plating copper metal to fill the first and second trenches. The method preferably comprises performing a chemical mechanical polishing process on selective portions of the conductor layer to remove portions of the conductor layer extending over a top of the first and second trenches. Furthermore, the method may further comprise configuring the second depth to extend three wiring levels deep.

Another embodiment of the invention provides a method of forming a high performance inductor, wherein the method comprises forming a plurality of wiring levels over a substrate; forming a first trench having a first depth in a first dielectric layer on a first wiring level; forming a second trench in the first dielectric layer having a second depth extending at least into a second wiring level, wherein the second depth extends three wiring levels deep; forming a conductor layer substantially simultaneously in the first and second trenches; and planarizing the conductor layer such that an upper height of the first and second trenches are co-planar. The method preferably comprises forming an interconnect structure in the first trench. The method may further comprise forming the second trench into a spiral-shaped trench. Additionally, the method may further comprise embedding the second trench within the plurality of wiring levels, wherein the forming of the conductor layer preferably comprises forming a liner along sidewalls of the first and second trenches; and plating copper metal to fill the first and second trenches. Moreover, the method preferably comprises performing a chemical mechanical polishing process on selective portions of the conductor layer to remove portions of the conductor layer extending over a top of the first and second trenches.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 1 is a flow diagram illustrating a preferred method according to an embodiment of the invention;

DETAILED DESCRIPTION OF PREFERRED EMBODIMENTS OF THE INVENTION

Figure 2A:
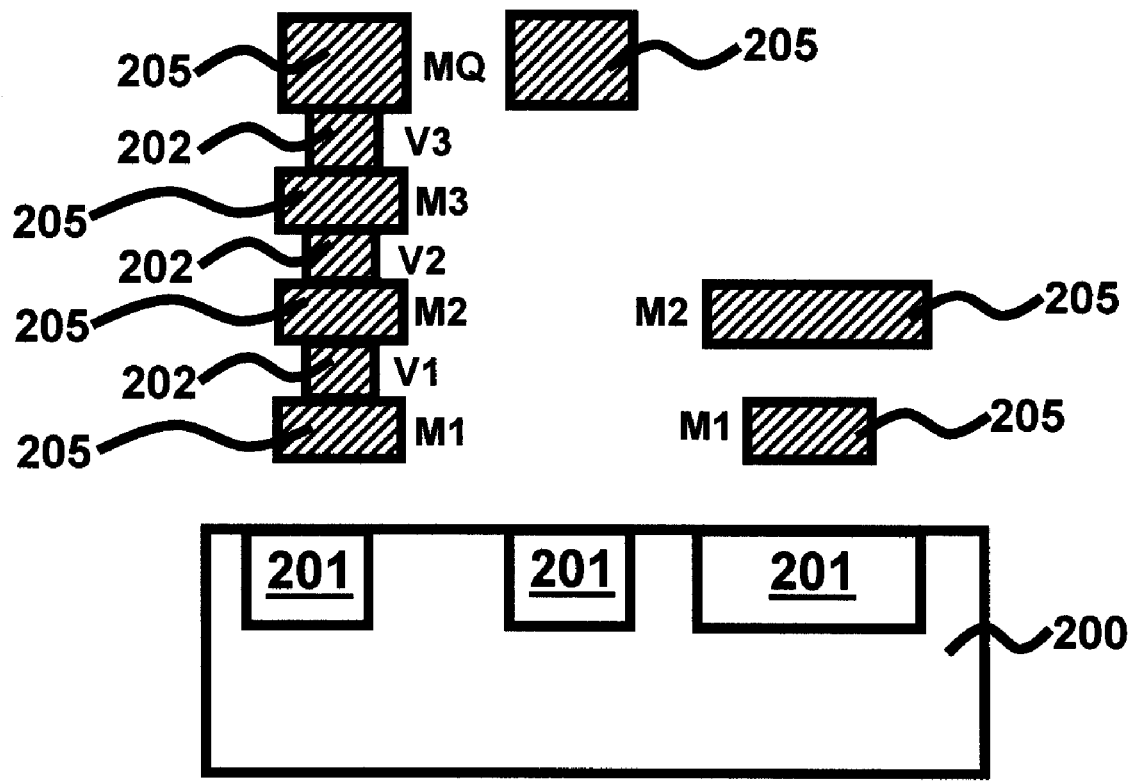
FIGS. 2(A) through 2(E) are cross-sectional schematics diagrams illustrating the formation of an inductor in conjunction with Cu BEOL wiring levels according to an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a novel fabrication technique for forming high performance inductors on integrated circuit structures. The embodiments of the invention achieve this by providing a method for high performance inductor fabrication using a triple damascene process with Cu BEOL. Referring now to the drawings, and more particularly to FIGS. 1 through 3, where similar reference characters denote corresponding features consistently throughout the figures, there are shown preferred embodiments of the invention.

FIG. 1 illustrates a flow diagram of a method of forming a high performance inductor according to an embodiment of the invention, wherein the method comprises forming (101) a plurality of wiring levels over a substrate. Here, all of the wiring levels, with the exception of the last Cu wire and via level, are formed. The next step involves forming (103) a first trench having a first depth in a first dielectric layer on a first wiring level. Here, the last Cu wiring level and via trenches are formed. Thereafter, the process involves forming (105) a second trench in the first dielectric layer having a second depth extending at least into a second wiring level, wherein the second depth extends three wiring levels deep. In this step, the second trench is preferably embodied as a spiral-shaped trench, which will serve as the eventual inductor trench and contacts the lower wiring level. The next step of the process involves forming (107) a conductor layer comprising Cu substantially simultaneously in the first and second trenches; and forming (109) a winding approximately 3 μm in thickness for an inductor in the second trench by removing portions of the conductor layer (e.g., Cu) overextending past a top of the first and second trenches (i.e., planarizing the Cu such that the upper height of the upper surface of the Cu in the first and second trenches is equal (i.e., co-planar)).

The method further comprises forming an interconnect structure in the first trench. Additionally, the method further comprises configuring an upper surface of the inductor winding such that the upper surface of the inductor winding is co-planar with an upper surface of the first dielectric layer. The method further comprises embedding the inductor winding within the plurality of wiring levels. Moreover, the step of forming the conductor layer comprises forming a liner along sidewalls of the first and second trenches; and plating copper metal to fill the first and second trenches. Furthermore, the method comprises performing a chemical mechanical polishing process on selective portions of the conductor layer to remove portions of the conductor layer overfilling the first and second trenches.

Figure 2B:
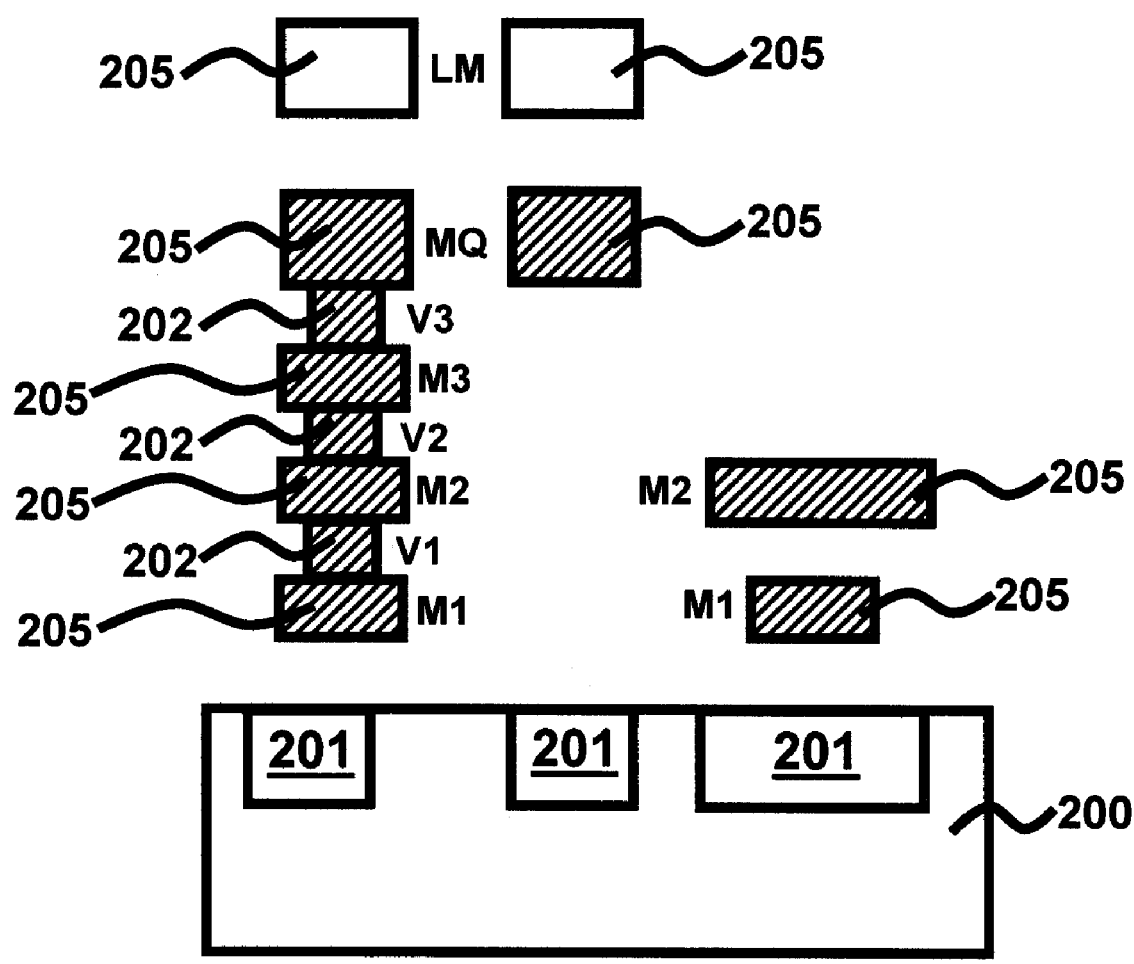
Figure 2C:
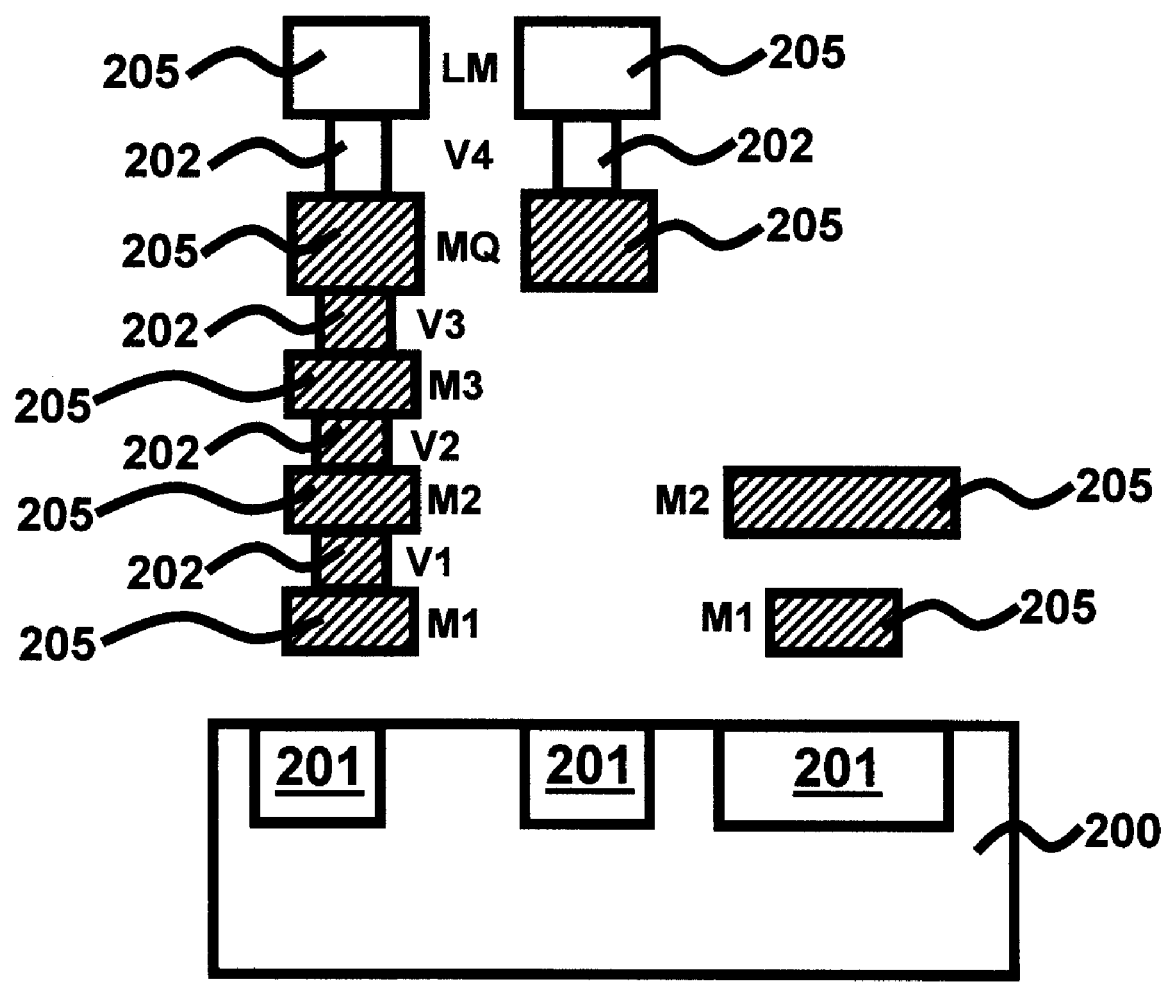
Figure 2D:
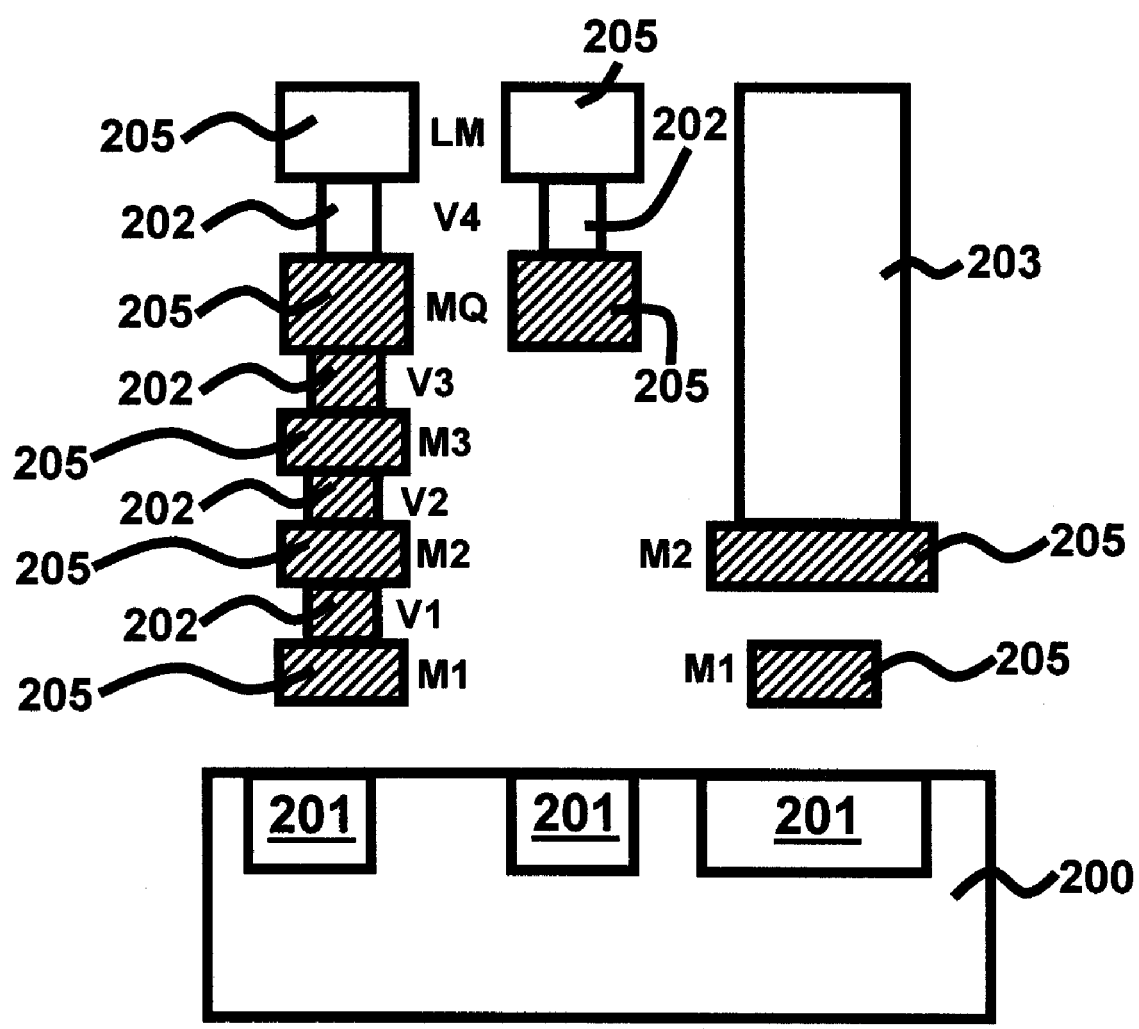
Figure 2E:
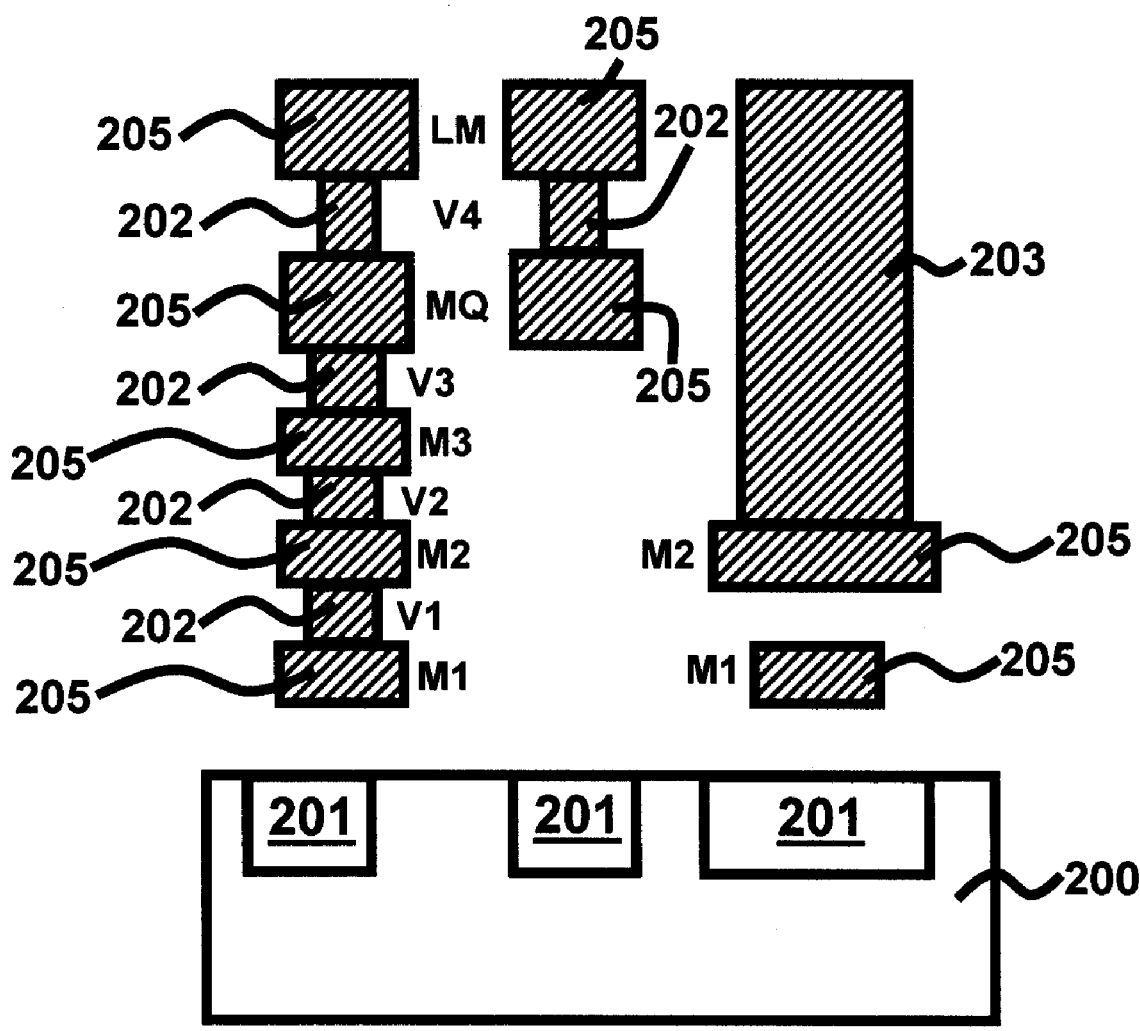
Figure 3:
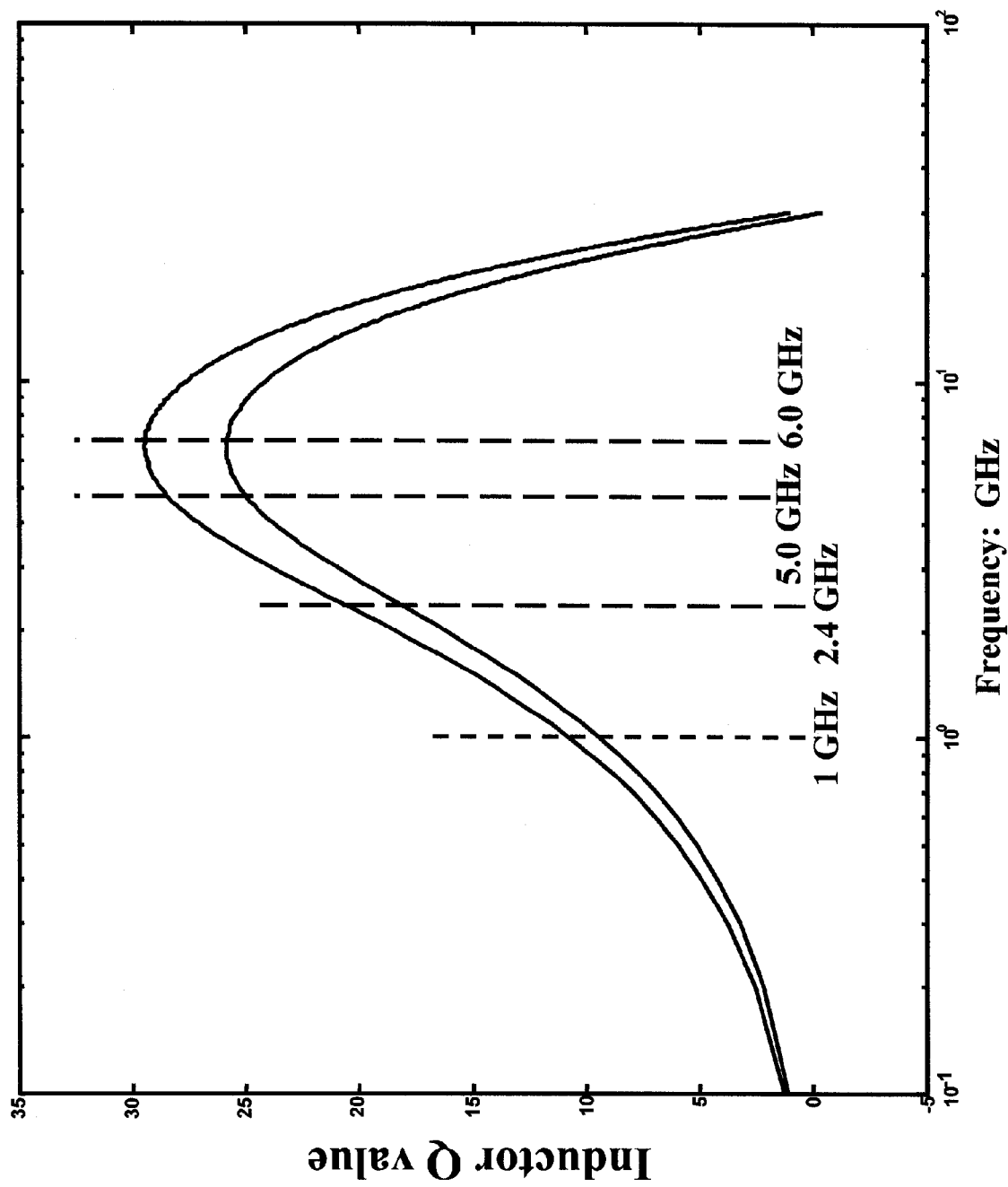
FIG. 3 illustrates graphical representation illustrating qualify factors (Q) of the inductors according to the embodiments of the invention.

FIGS. 2(A) through 2(E) illustrate a sequential processing technique for forming a structure according to the embodiments of the invention. The structure includes a silicon substrate 200 having a plurality of shallow trench isolation (STI) regions 201 configured therein. Various wiring levels 205 (M1, M2, M3, MQ, LM) are shown over the substrate 200, each being connected to a subsequent wiring level by a via 202 (V1, V2, V3). As shown in FIG. 2(A), a Cu BEOL process is performed whereby M1, Ms, M3, and MQ trenches and vias V1, V2, V3 are filled with Cu. Next, as illustrated in FIG. 2(B), an upper trench 205, (LM), is formed according to a first damascene process. Then, as depicted in FIG. 2(C), a via 202 (V4) is formed according to a second damascene process between the upper trench 205 (LM) and the next highest trench 205 (MQ). Thereafter, as shown in FIG. 2(D), an inductor trench 203 is formed according a third damascene process, wherein the inductor trench is preferably configured in a spiral-shape and extends to at least wiring level M2. Finally, as indicated in FIG. 2(E), trench LM, via V4, and inductor trench 203 are simultaneously filled (for example, using electroplating) with Cu, with the excessive Cu being polished off using well-known polishing techniques such as chemical-mechanical polishing (CMP) to form a planarized structure. The lowest wiring level M1 acts as a shield for the high-Q inductor coil 203, which is preferably formed beginning at wiring levels M2 or M3.

The embodiments of the invention provide a method where high performance inductors 203 are fabricated in Cu BEOL without the disadvantages associated with the conventional techniques. High-Q value inductors 203 are manufactured using triple damascene processing with minimal additional cost because many of the processing steps can be performed simultaneously thereby eliminating extra processing steps, time, and cost. According to the embodiments of the invention, the high-Q value inductors 203 are embedded inside Cu BEOL dielectric layers (not shown) and are co-planar to the last metal wire of the CMOS device (LM level). As a result, full CMOS/ASIC compatibility is achieved.

As provided in FIG. 3, simulation data (two data curves are generated) indicates that inductors 203 fabricated using the embodiments of the invention provide a good solution to RF applications where a frequency below 6 GHz is used. The top of the inductor level is co-planar to the last metal wire (LM) of the CMOS BEOL. Moreover, according to the embodiments of the invention, the fabrication of the inductor 203 is achieved through the use of a dedicated lithography mask (not shown) for the inductor 203 after CMOS LM wire and via 202 patterning (but prior to Cu fill). The connection of the inductor 203 to a lower Cu level such as M3 (with the presence of M4 metal wire (not shown)) or M2 (in the absence of M4 metal wire) is made such that parts of M3 or M2 wires can be incorporated into inductor 203.

The several embodiments of the invention can be used to form integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of the specific embodiments will so fully reveal the general nature of the embodiments of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention has been described in terms of preferred embodiments, those skilled in the art will recognize that the embodiments of the invention can be practiced with modification within the spirit and scope of the appended claims.

What is claimed is:

1. A method of forming a high performance inductor, said method comprising:
   providing a substrate;
   forming a plurality of wiring levels over said substrate such that said wiring levels comprise at least: a first wiring level; a second wiring level between said first wiring level and said substrate; and a third wiring level between said second wiring level and said substrate,
      wherein said forming of said plurality of wiring levels further comprises forming said plurality of wiring levels with a first metal wire above a first portion of said substrate and in one of said wiring levels below said first wiring level and with a second metal wire above a second portion of said substrate and in a different lower one of said wiring levels below said first wiring level;
   performing a triple damascene process, wherein said performing of said triple damascene process comprises:
      forming a first trench in a first dielectric layer of said first wiring level such that said first trench is above said first metal wire;
      forming a via through a bottom surface of said first trench to said first metal wire;
      forming a spiral-shaped second trench through said first dielectric layer of said first wiring level and through any intervening dielectric layers of any intervening wiring levels to said second metal wire; and
      forming a conductor layer substantially simultaneously in said first trench, said via and said second trench; and
   removing portions of said conductor layer overfilling said first and second trench so as to form a last metal wire, for a semiconductor device, in said first trench and a spiral-shaped inductor in said second trench.

2. The method of claim 1, all the limitations of which are incorporated herein by reference, further comprising, during said forming of said plurality of wiring levels, forming a third metal wire below said second metal wire to shield said inductor from said substrate.

3. The method of claim 1, all the limitations of which are incorporated herein by reference, wherein said removing of said portions of said conductor layer comprises planarizing said conductor layer such that an upper height of said last metal wire in said first trench and of said inductor in said second trench are coplanar.

4. The method of claim 1, all the limitations of which are incorporated herein by reference, further comprising embedding said inductor within said plurality of wiring levels.

5. The method of claim 1, all the limitations of which are incorporated herein by reference, wherein said forming of said conductor layer comprises:
   forming a liner along sidewalls of said first trench, said via and said second trench; and
   plating copper metal to fill said first trench, said via and said second trench.

6. The method of claim 1, all the limitations of which are incorporated herein by reference, wherein said removing of said portions of said conductor layer overfilling said first trench and said second trench comprises performing a chemical mechanical polishing process on selective portions of said conductor layer such that an upper height of said last metal wire in said first trench and of said inductor in said second trench are coplanar.

7. The method of claim 1, all the limitations of which are incorporated herein by reference, wherein said forming of said plurality of wiring levels further comprises forming said plurality of wiring levels such that at least two intervening wiring levels separate said first wiring level and said second wiring level so that, after said forming of said second trench, said second trench has a depth that extends at least three wiring levels deep.

8. A method of forming a high performance inductor, said method comprising:
   providing a semiconductor substrate;
   forming a plurality of wiring levels over said semiconductor substrate such that said wiring levels comprise at least: a first uppermost wiring level; a second wiring level between said first uppermost wiring level and said substrate; and a third wiring level between said second wiring level and said semiconductor substrate,
      wherein said forming of said plurality of wiring levels further comprises forming said plurality of wiring levels with a first metal wire above a first portion of said semiconductor substrate and in one of said wiring levels below said first uppermost wiring level, with a second metal wire above a second portion of said substrate and in said second wiring level, and with a third metal wire in said third wiring level between said second metal wire and said substrate;
   performing a triple damascene process, wherein said performing of said triple damascene process comprises:
      forming a first trench, having a first depth, in a first dielectric layer of said first uppermost wiring level such that said first trench is above said first metal wire;
      forming a via through a bottom surface of said first trench to said first metal wire;
      forming a spiral-shaped second trench through said first dielectric layer of said first uppermost wiring level and through any intervening dielectric layers of any intervening wiring levels to said second metal wire, wherein said second trench is formed having a second depth that is greater than said first depth;
      forming a conductor layer substantially simultaneously in said first trench, said via, and said second trench; and
   planarizing said conductor layer so as to form a last metal wire, for a semiconductor device, in said first trench and a spiral-shaped inductor in said second trench.

9. The method of claim 8, all the limitations of which are incorporated herein by reference, wherein said third metal wire shields said inductor from said substrate.

10. The method of claim 8, all the limitations of which are incorporated herein by reference, wherein said forming of said spiral-shaped second trench comprises using a dedicated lithography mask.

11. The method of claim 8, all the limitations of which are incorporated herein by reference, further comprising embedding said spiral-shaped second trench within said plurality of wiring levels.

12. The method of claim 8, all the limitations of which are incorporated herein by reference, wherein said forming of said conductor layer comprises:
   forming a liner along sidewalls of said first trench, said via and said second trench; and plating copper metal to fill first trench, said via and said second trench.

13. The method of claim 8, all the limitations of which are incorporated herein by reference, wherein said planarizing comprises performing a chemical mechanical polishing process on selective portions of said conductor layer to remove portions of said conductor layer extending over a top of first trench and said second trench such that an upper height of said last metal wire in said first trench and of said inductor in said second trench are coplanar.

14. The method of claim 8, all the limitations of which are incorporated herein by reference, wherein said forming of said plurality of wiring levels further comprises forming said plurality of wiring levels such that at least two intervening wiring levels separate said first wiring level and said second wiring level so that, after said forming of said second trench, said second trench has a depth that extends at least three wiring levels deep.

15. A method of forming a high performance inductor, said method comprising:
  providing a substrate;
  forming a plurality of wiring levels over said substrate such that said wiring levels comprise at least: a first wiring level; a second wiring level between said first wiring level and said substrate; and a third wiring level between said second wiring level and said semiconductor substrate,
    wherein said forming of said plurality of wiring levels further comprises forming said plurality of wiring levels with a first metal wire above a first portion of said semiconductor substrate and in one of said wiring levels below said first wiring level, with a second metal wire above a second portion of said substrate and in said second wiring level, and with a third metal wire in said third wiring level between said second metal wire and said substrate;
  performing a triple damascene process, wherein said performing of said triple damascene process comprises:
    forming a first trench, having a first depth, in a first dielectric layer of said first wiring level such that said first trench is above said first metal wire;
    forming a via through a bottom surface of said first trench to said first metal wire;
    forming a spiral-shaped second trench through said first dielectric layer of said first wiring level and through any intervening dielectric layers of any intervening wiring levels, wherein said second trench is formed having a second depth that is greater than said first depth and wherein said forming of said plurality of wiring levels further comprises forming said plurality of wiring levels such that at least two intervening wiring levels separate said first wiring level and said second wiring level so that, after said forming of said second trench, said second trench has a depth that extends at least three wiring levels deep;
    forming a conductor layer substantially simultaneously in said first trench, said via, and said second trench; and
  planarizing said conductor layer so as to form a last metal wire, for a semiconductor device, in said first trench and a spiral-shaped inductor in said second trench such that an upper height of said last metal wire in said first trench and of said inductor in said second trench are co-planar.

16. The method of claim 15, all the limitations of which are incorporated herein by reference, wherein said third metal wire shields said inductor from said substrate.

17. The method of claim 15, all the limitations of which are incorporated herein by reference, wherein said forming of said second trench-comprises using a dedicated lithography mask.

18. The method of claim 15, all the limitations of which are incorporated herein by reference, further comprising embedding said second trench within said plurality of wiring levels.

19. The method of claim 15, all the limitations of which are incorporated herein by reference, wherein said forming of said conductor layer comprises:
  forming a liner along sidewalls of said first trench, said via and said second trench; and
  plating copper metal to fill first trench, said via and said second trench.

20. The method of claim 15, all the limitations of which are incorporated herein by reference, wherein said planarizing further comprises performing a chemical mechanical polishing process on selective portions of said conductor layer to remove portions of said conductor layer extending over a top of said first trench and said second trench.

* * * * *